United States Patent [19]
Chabert et al.

[11] Patent Number: 5,313,372
[45] Date of Patent: May 17, 1994

[54] TERMINAL BLOCK FOR AUTOMATION DEVICE

[75] Inventors: Jean-Marie Chabert, Valbonne; André Goletto, Antibes, both of France

[73] Assignee: Telemecanique, France

[21] Appl. No.: 998,342

[22] Filed: Dec. 30, 1992

[30] Foreign Application Priority Data

Dec. 30, 1991 [FR] France ................. 91 16397

[51] Int. Cl.$^5$ ............................. H01R 9/00
[52] U.S. Cl. ............................. 361/823; 174/60
[58] Field of Search ............ 361/426, 427, 428, 429, 361/430, 331; 439/709, 713, 718; 174/52.1, 53, 54, 58, 60, 61-64

[56] References Cited

U.S. PATENT DOCUMENTS

| | | | |
|---|---|---|---|
| 3,784,728 | 1/1974 | De Bortoli et al. | 174/59 |
| 4,835,659 | 5/1989 | Goodson | 361/426 |

FOREIGN PATENT DOCUMENTS

| | | |
|---|---|---|
| 0123595 | 10/1984 | European Pat. Off. . |
| 0312747 | 4/1989 | European Pat. Off. . |
| 2835346 | 2/1980 | Fed. Rep. of Germany . |
| 3932005 | 4/1990 | Fed. Rep. of Germany . |

Primary Examiner—Leo P. Picard
Assistant Examiner—Bot Ledinh
Attorney, Agent, or Firm—William A. Drucker

[57] ABSTRACT

Terminal block for automation device, notably for programmable controller, mounted movably and electrically connected to an interface module. The lateral wall of the body of the terminal block which is situated on the side of the openings for passage of the flexible leads connected the units of the automated system comprises a pivoting flap.

7 Claims, 1 Drawing Sheet

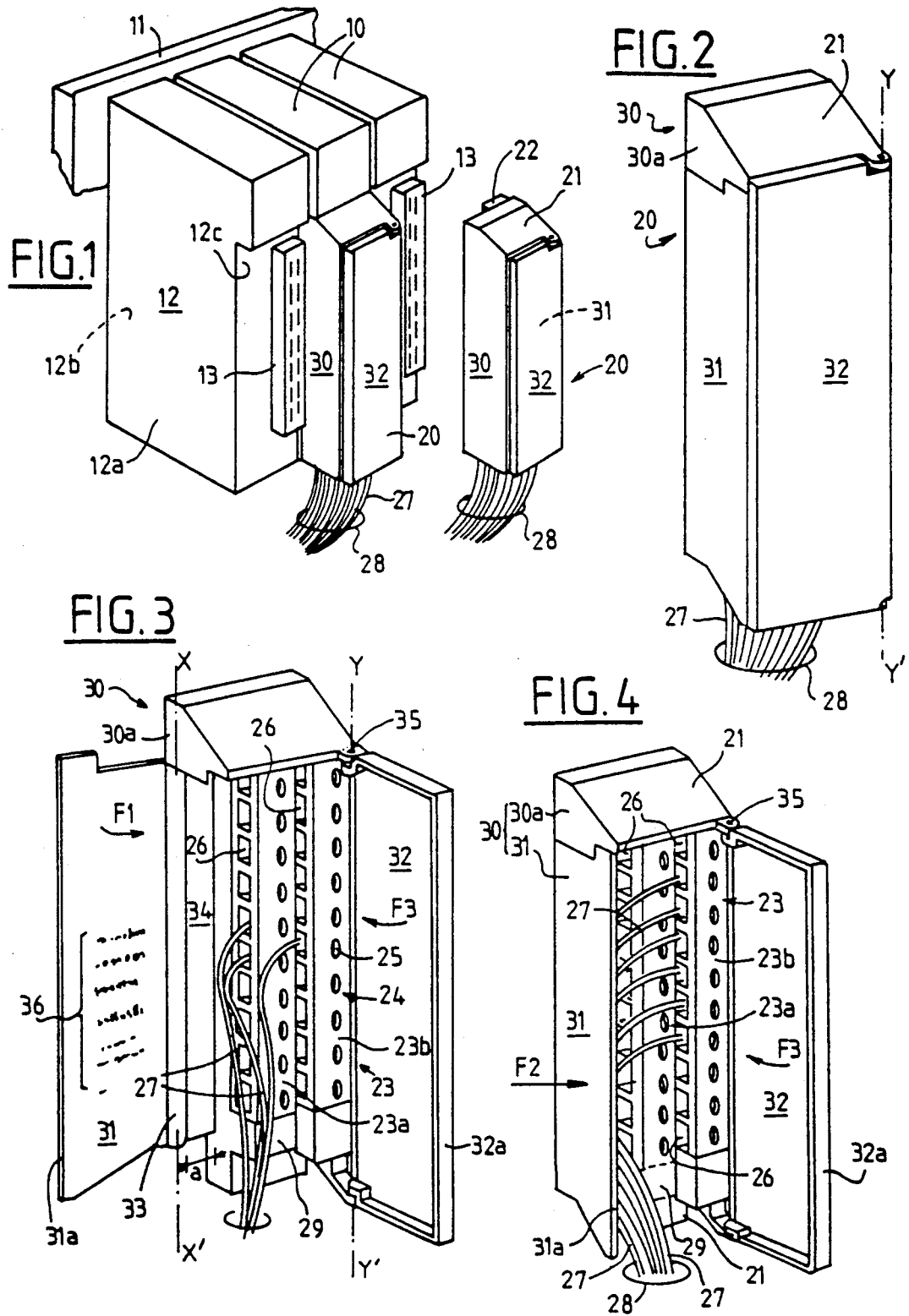

TERMINAL BLOCK FOR AUTOMATION DEVICE

BACKGROUND OF THE INVENTION

1. Field of the Invention

This invention relates to a terminal block for an automation device, more particularly for a programmable controller, comprising a movable terminal block body that can be mounted on and electrically connected to an electronic processing module or interface module of the automation device.

2. Description of the Prior Art

Such a terminal block, known after French patent No. 2,544,556, comprises connection terminals, on the one hand electrically connected to connection elements specific to the module, and, on the other hand, susceptible of receiving and clamping ends of leads connected to units of the automated system of which acquisition of the status or control of the working according to a predetermined program is required. The clamping terminals have, to the front, openings for access by a tool such as a screwdriver, and, to the side, openings for the passage of the ends of the leads to be clamped. The body of the terminal block also has a lateral gorge to house the bundle of leads, and a closing front wall and lateral walls.

The words "front" and "rear" in this instance qualify elements respectively situated towards and opposite the operator in the normal position for utilisation of the device.

It is preferable that the operator be able to easily wire and use a terminal block of the type described.

OBJECT OF THE INVENTION

The main object of this invention is to facilitate the connection, housing and protection of the leads of such a terminal block.

SUMMARY OF THE INVENTION

Accordingly, the lateral wall of the terminal block body situated to the side of the openings for insertion of the leads comprises a flap pivoting laterally around a vertical axis. Preferably, the flap is applied in the course of closure against the bundle of leads in a direction substantially parallel to the direction of insertion of the leads in the openings of the terminals in order to press the bundle in a direction confirming the connection; the inner side of the flap can bear inscriptions relating to the wiring. When the front closing wall is a pivoting door, the pivoting flap and the pivoting door rotate around parallel vertical axes, the closure of the door confirming that of the flap.

BRIEF DESCRIPTION OF THE DRAWINGS

A non-limiting example of an embodiment of the invention will now be described in reference to the drawings in which:

FIG. 1 represents, in perspective, a programmable controller fitted with terminal blocks embodying the invention;

FIGS. 2, 3 and 4 show the terminal block in the respective positions of normal utilisation, wiring and bringing of pressure to bear on the leads after wiring.

DESCRIPTION OF THE PREFERRED EMBODIMENTS

The programmable controller illustrated in FIG. 1 comprises plural electronic interface processing modules 10, hung and secured by means not represented to a rear support 11 such as a plate or mounting base. Each module, e.g. with an input or output function, encloses in a housing 12 with lateral walls 12a, rear wall 12b and front wall 12c, processing electronics organized by means of one or more printed circuits bearing appropriate components. From the front wall 12c protrudes a connector 13 connected to the printed circuit, which in turn is electrically connected at its rear part, via a connector that is not represented, to a communication structure linking the modules to one another and to a common processor.

On the front wall 12c is fixed, by a known means, a terminal block 20 comprising a terminal block body 21 and a rear connector 22 destined to cooperate with the connector 13 of the module. The terminal block body 21 comprises series 23 of clamping and connection terminals 24 accessible from the front via openings 25 by a tool manipulated by the operator. Two series of terminals 23a, 23b, offset laterally and as regards depth, have been represented.

Each terminal 24 receives, in a lateral opening 26 of horizontal axis, the bare end of one or two flexible electrical leads or an optical conductor 27 connected to a device, such as a sensor or an activating device, of the automated system. The leads 27 of each series of terminals can be seen to form a bundle 28 housed in a vertical gorge 29, at least partially disposed laterally to the series of terminals, of the terminal block body 21, the bundle 28 exiting the gorge vertically.

The body 21 has lateral walls 30 and a front wall 32. The wall 30 situated on the side of the lateral passage openings 26 is at least partly formed by a pivoting flap 31. The front wall 32 is formed by a pivoting door. The pivoting flap 31 and the pivoting door 32 both pivot around parallel and vertical axes X—X', Y—Y', pivoting thereof being limited by stop elements. Axis X—X' is materialized by a hinge 33 moulded in one piece with the flap 31 and a set wing 34 connecting to the terminal block body 21. Axis Y—Y' is materialized by pivot pins 35.

In the closed position of the terminal block 20 (FIG. 2), the flap 31 and the door 32 meet at their free edges 31a, 32a, while the flap 31 constitutes the major part of the lateral wall 30 of the terminal block body 21, and is situated in the plane of the remaining part 30a of the wall 30 and in the plane of the lateral wall 12a of the module. Covering, catching and similar elements can be provided for confirming closure of the flap 31 with regard to the fixed part of the body 21 and/or for the door 32 to confirm the closed position of the flap 31.

After opening the flap 31 and inserting and securing the leads 27 to the respective terminals 24, the operator closes the flap 31 in the direction of the arrow F1 (FIG. 3) until abutment and, when applicable, catching of the flap, which has the effect of pressing the bundle 28 of leads in the direction of the arrow F2 (FIG. 4) and of reducing its volume swell; the direction of arrow F2 is substantially parallel to the direction of insertion of the ends of the leads in the openings 26 of the terminals; the securing of the leads in the terminals is thus confirmed without risking extraction thereof, and, in order to house a given number of leads, a terminal block of smaller width than conventional terminal blocks is sufficient. The operator then closes the door 32 in the direction of the arrow F3 and the door confirms the closure of the flap 31 by means of elements of suitable shape.

Inscriptions 36 concerning information of a different nature than the information figuring on the outside of the door 32 and notably relating to the wiring can be advantageously added to the inner side of the pivoting flap 31; on its outer side 32b, the door 32 bears inscriptions 37 relating to the type and operating of the module and the devices connected to it.

We claim:

1. A terminal block for an automated system, comprising:
    a terminal block body that can be mounted movably on and electrically connected to an electronic processing module and which comprises terminals for connecting connection elements of said module to ends of a bundle of flexible leads for connecting devices of said automated system,
    said terminals comprising, towards a front face, openings for access by a tool, and towards a lateral face, lateral openings for insertion of the lead ends,
    a vertical gorge for housing the bundle of leads,
    a closing front wall and lateral walls, wherein the lateral wall situated on the side of said lateral openings for insertion of the leads comprises a laterally pivoting flap.

2. The terminal block as claimed in claim 1, wherein said laterally pivoting flap is applied in the course of closure against said bundle of leads for compressing it in a direction parallel to the direction of insertion of said leads in said lateral openings.

3. The terminal block as claimed in claim 1, wherein the closing front wall is a pivoting door, said pivoting flap and said pivoting door rotating around parallel axes.

4. The terminal block as claimed in claim 1, wherein the inner side of said pivoting flap bears inscriptions of a different nature to those on the outside of said closing front wall.

5. The terminal block as claimed in claim 1, wherein the closure of said pivoting flap with regard to the terminal block body is confirmed by stopping or catching means.

6. The terminal block as claimed in claim 3, wherein said pivoting door cooperates in the closed position with said pivoting flap for confirming closure of the latter.

7. The terminal block as claimed in claim 2, wherein the closing front wall is a pivoting door, said pivoting flap and said pivoting door rotating around parallel axes.

* * * * *